(12) United States Patent
Spaunhorst (10) Patent No.: US 7,569,907 B2
(45) Date of Patent: Aug. 4, 2009

(54) HYBRID CHIP FUSE ASSEMBLY HAVING WIRE LEADS AND FABRICATION METHOD THEREFOR

(75) Inventor: Vernon Raymond Spaunhorst, Washington, MO (US)

(73) Assignee: Cooper Technologies Company, Houston, TX (US)

( * ) Notice: Subject to any disclaimer, the term of this patent is extended or adjusted under 35 U.S.C. 154(b) by 247 days.

(21) Appl. No.: 11/091,665

(22) Filed: Mar. 28, 2005

(65) Prior Publication Data

US 2006/0214259 A1    Sep. 28, 2006

(51) Int. Cl.
*H01L 29/00* (2006.01)
*H01L 23/58* (2006.01)

(52) U.S. Cl. ..................... 257/529; 257/665

(58) Field of Classification Search ............... 257/684, 257/690, 692, 693, 696, 784, 173, 529, 665, 257/E23.149, E21.592; 438/132, 215, 281, 438/333, 467, 601
See application file for complete search history.

(56) References Cited

U.S. PATENT DOCUMENTS

| 4,540,969 A | 9/1985 | Sugar |
| 4,540,970 A | 9/1985 | Kasamatsu |
| 4,636,765 A | 1/1987 | Krueger |
| 5,097,246 A * | 3/1992 | Cook et al. ................. 337/297 |
| 5,760,453 A * | 6/1998 | Chen .......................... 257/529 |
| 5,774,037 A | 6/1998 | Gurevich |
| 5,982,268 A | 11/1999 | Kawanishi |
| 6,879,018 B2 * | 4/2005 | Marr et al. .................. 257/529 |
| 2006/0214259 A1 | 9/2006 | Spaunhorst |

FOREIGN PATENT DOCUMENTS

| EP | 0 453 217 A1 | 10/1991 |
| JP | 2000 260280 A | 9/2000 |
| WO | 89/08925 A1 | 9/1989 |

OTHER PUBLICATIONS

International Search Report for International Application No. PCT/US2006/011527; Nov. 28, 2006; 6 pages.

* cited by examiner

*Primary Examiner*—Hung Vu
(74) *Attorney, Agent, or Firm*—Armstrong Teasdale LLP (57) ABSTRACT

A chip fuse includes a substrate, a fuse element extending on the substrate, and first and second wire leads coupled to the fuse element. Contact pads may extend over portions of the fuse element and establish electrical connection to the first and second leads. A conductive medium such as solder encircles the substrate to securely form a mechanical and electrical connection to the leads.

29 Claims, 5 Drawing Sheets

HYBRID CHIP FUSE ASSEMBLY HAVING WIRE LEADS AND FABRICATION METHOD THEREFOR

BACKGROUND OF THE INVENTION

This invention relates generally to fuses, and more particularly to chip fuses for protecting electronic devices from damaging electrical currents.

Fuses are widely used as overcurrent protection devices to prevent costly damage to electrical circuits. Typically, fuse terminals or contacts form an electrical connection between an electrical power source and an electrical component or a combination of components arranged in an electrical circuit. One or more fusible links or elements, or a fuse element assembly, is connected between the fuse terminals or contacts, so that when electrical current through the fuse exceeds a predetermined threshold, the fusible elements melt, disintegrate, sever, or otherwise open the circuit associated with the fuse to prevent electrical component damage.

A proliferation of electronic devices in recent times has resulted in increased demands on fusing technology. For example, a conventional fuse for electronic application includes a wire fuse element (or alternatively a stamped and/or shaped metal fuse element) encased in a glass cylinder or tube and suspended in air within the tube. The fuse element extends between conductive end caps attached to the tube for connection to an electrical circuit. However, when used with printed circuit boards in electronic applications, the fuses typically must be quite small, and tend to require leads which may be soldered to a circuit board having through-holes therein for receiving the leads. Miniature electronic fuses of this type are known and can be effective in protecting electronic circuitry.

At least in part to avoid manufacturing and installation difficulties of miniature electronic fuses, chip fuses have been developed which may be surface mounted to circuit boards, thereby eliminating the fuse tube and the lead assemblies, while at the same time providing better fusing characteristics (e.g., faster acting fuses) for some electronic circuits. Such chip fuses may include, for example, a substrate layer, a fuse element layer, one or more insulative or protective layers overlying the fuse element layer, and end terminations formed over the substrate and the fuse element layer for surface mounting to a circuit board. While known chip fuses provide low cost fuse products that are easily soldered to circuit boards, they are difficult to replace when a fuse opens to interrupt an electrical circuit, and as the boards are generally inoperable due to the opened fuse, the circuit boards, and sometimes the entire electronic device associated with the circuit boards, are typically discarded. This is problematic, however, in certain installations involving expensive boards and equipment for which disposal is not a practical option.

For example, known memory chips for computer and processor applications typically must be tested prior to use, and one of the tests is known as a burn-in test. The burn-in test evaluates continuous operation of the memory chip before being put to use, and the memory chips are typically subjected to an elevated temperature above anticipated operating electrical conditions. Stability issues, defects, and early-life failures of the memory chips may be revealed in the burn-in test.

In one known burn-in testing system, a large number of memory chips are connected to a large circuit board with chip sockets that receive the memory chips, and chip fuses are used to protect the electronics of the system in the event of failure of the memory chips. When one or more of the chip fuses opens, the associated chip socket or sockets becomes inoperable, and because the chip fuse is surface mounted to the board, it is not practical to remove and replace the operated fuse or fuses. To allow the chip sockets to be used nonetheless, it has been proposed to provide though-holes in and/or fuse sockets or clips mounted to the board of at least one known testing system so that miniature electronic fuses may be mounted to the board with leads of the fuses being received in the through-holes and secured with, for example, the fuse sockets or fuse clips to establish an electrical connection in parallel with the operated fuse. While the miniature electronic fuses may be a viable solution to restoring use of a chip socket or sockets affected by an operated chip fuse, known miniature electronic fuses having leads are disadvantaged as they tend to have different operating characteristics than chip fuses, and therefore the two types of fuses perform differently and provide non-uniform protection of the electrical system.

BRIEF DESCRIPTION OF THE INVENTION

According to an exemplary embodiment, a chip fuse comprises a substrate, at least one fuse element extending on the substrate, and first and second leads coupled to the fuse element layer.

Optionally, the substrate is substantially rectangular, and each of the first and second leads are wire leads coupled to cylindrical caps, with each of the caps encircling an end of the substrate. The caps are spaced from outer surfaces of the substrate, thereby forming a void between said cap and said substrate, and the void filled by a conductive medium to surround the substrate within the cap. The conductive medium may be, for example, solder, a conductive adhesive, a brazing alloy, or another material forming a mechanical and electrical connection between the fuse element, the end caps, and the wire leads.

According to another exemplary embodiment, a chip fuse comprises a substrate layer having a first end, a second end, and opposing surfaces extending between the first end and the second end, first and second wire lead assemblies coupled to the fuse element layer, and a fuse element extending over the substrate layer and mechanically and electrically connected to the first and second lead assemblies.

In another aspect, a method of fabricating a chip fuse having a fuse element layer extending on a substrate layer is provided. The method comprises forming contact pads on each of opposed surfaces of the substrate layer, at least some of the pads being in electrical contact with the fuse element, and attaching leads to the respective ends of the substrate using the contact pads.

DETAILED DESCRIPTION OF THE INVENTION

Figure 1:
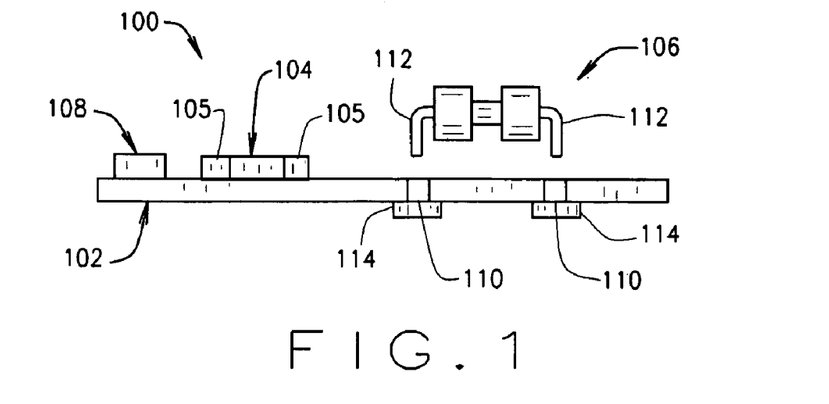
FIG. 1 is a side elevational schematic of a circuit board system including a leaded chip fuse according to the present invention.

FIG. 1 is a side elevational schematic of a circuit board system 100 including a circuit board 102, a first subminiature circuit protector in the form of a surface mounted chip fuse 104, and a second subminiature circuit protector in the form of a leaded chip fuse 106 according to the present invention.

The circuit board 102 is fabricated from known materials and includes conductive pads, traces, etc. (not shown in FIG. 1) which interconnects electrical components 108 and associated circuitry. In one embodiment, the circuit board 102 is configured for testing components 108, such as, for example, memory chips or other components, including but not limited to burn-in testing of the components. In such an embodiment, the circuit board 102 may include a large number of surface mounted chip fuses 104 each protecting component sockets (not shown in FIG. 1) associated with the components 108 on the board 102. Thus, a large number of components may be tested simultaneously on the board 102.

In one embodiment, the surface mounted chip fuse 104 is a known circuit protector including one or more substrate layers, one or more fusible elements extending on the substrate layer, and protective layers overlying the fuse element or elements and coupled together by a known process, such as, for example, lamination processes known in the art to produce a monolithic structure. End terminations 105 are formed on the ends of the structure in known manner and the end terminations are surface mounted to the board 102 using known techniques. Surface mount chip fuses 104 are commercially available from, for example, Cooper/Bussmann of St. Louis, Mo., and the chip fuses 104 provide overcurrent protection to circuitry associated with the board 102.

In use, when one or more of the surface mounted chip fuses 104 operate to interrupt the current path through the fuses 104 and open the electrical circuit through the fuse element therein, the component socket associated with the fuse 104 is no longer operational to test components 108, and the capacity of the board 102 to test components 108 is diminished. In other words, because of the opened fuses 104, the number of components 108 that can be tested on the board 102 is reduced. As more of the fuses 104 operate over time, the reduced capacity of the board can be a real impediment to efficient testing of the components 108.

As replacing the entire board 102 to restore the full testing capacity of the system 100 is not a practical option, and because the surface mount fuses 104 on the board 102 are not amenable to quick removal and replacement, the board 102 includes features to connect fuses 106 to the board in parallel with the operated fuses 104 to restore the full testing capacity of the system 100. More specifically, the board 102 includes circuit traces connected to each socket for components 108, and the circuit traces are connected in parallel with the circuit traces to which the end terminations 105 of the fuse 104 are terminated. The circuit traces define a conductive path to through-holes 110 in the board 102 which receive axial leads 112 of the chip fuse 106. The chip fuse 106 may be connected to the board 102 via the leads 112 and the through-holes 110 to restore operation of component sockets for components 108 after the fuses 104 have operated, without removing the operated fuses 104 from the board. That is, the leaded chip fuse 106 may be quickly connected to the board 102 so that components 108 may continue to be tested using the full capacity of the board 102, while still providing fuse protection to the entire board 102. Fuse sockets or clips 114 may be mounted to a lower surface of the board 102 to quickly connect the leads 112 to the board.

Unlike known miniature electronic fuses having axial leads, the leaded chip fuse 106 provides comparable, if not exact, fuse performance to that of the surface mounted chip fuses 104. Further, and unlike known chip fuses, the fuses 106 may mounted to the board with through-hole termination with the leads 112 rather than with surface mount techniques. The leaded chip fuses 106 may be provided at relatively low cost, and may be fabricated to withstand necessary handling for installation to the board 102. Specifically, because chip fuse structures are generally incompatible with known wire lead assemblies, securing the leads 112 to the chip fuse structure in the leaded chip fuse 106 has proven challenging due to a tendency of the leads 112 to separate from the chip fuse structure during handling and installation of the fuse 106, particularly due to applied forces and stress due to bending of the leads 112 for installation of the fuse 106 to the board 102. The exemplary embodiments of the fuse 106, as described herein below, provide a secure assembly which may be reliably connected to the through-holes 110 of the board 102 for restoring the full testing capacity of the board 102 even as the surface mount chip fuses 104 operate during testing of components. The fuse 106 therefore provides the convenience of axial lead termination with the performance of chip fuse technology, and thus is sometimes referred to herein as a hybrid chip fuse having aspects of both conventional chip fuses and conventional miniature electronic fuses to meet a need that neither conventional chip fuses nor conventional miniature electronic fuses are capable of addressing on their own.

While the invention is described in the context of burn-in testing for electronic components such as memory chips, it is appreciated that the benefits of the invention accrue generally to electronic systems and assemblies having fuses, and wherein replacement of chip fuses for restoring and reenergizing circuitry associated with an operated fuse while providing comparable fuse behavior and performance to an opened or operated surface mount chip fuse is desirable. Thus, the burn-in testing application is but one exemplary application for the leaded chip fuse 106 according to the present invention, and the description of the same is provided for illustrative purposes only. The invention is not intended to be limited to any particular end use or application.

Figure 2:
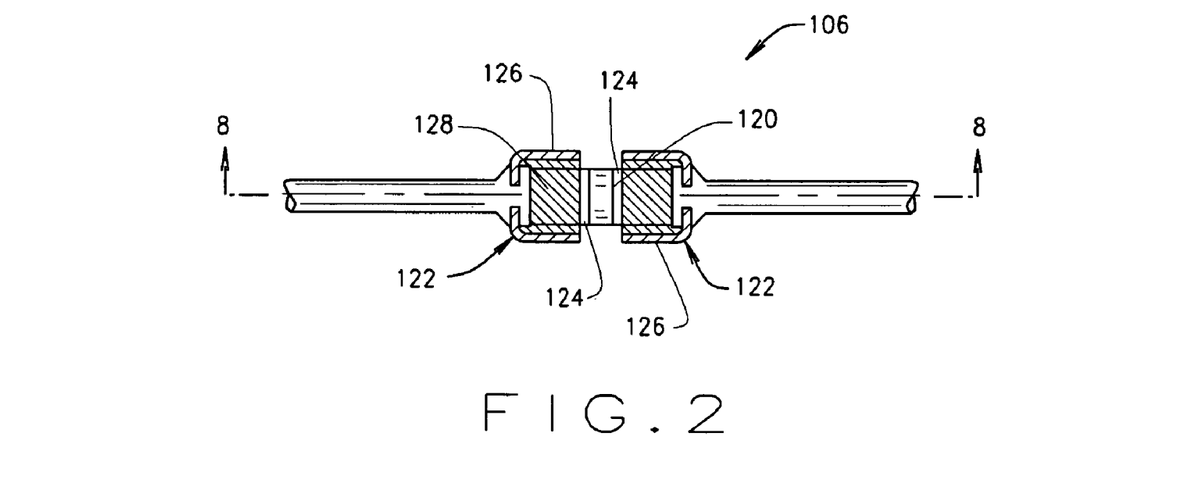
FIG. 2 is an enlarged sectional schematic view of the leaded chip fuse shown in FIG. 1.

FIG. 2 is an enlarged sectional schematic view of the leaded chip fuse 106, including a chip assembly 120 and cap and lead assemblies 122 attached to either end thereof. The chip assembly 120 is generally rectangular in an exemplary embodiment, and includes contact pads 124 which establish electrical connection between a fuse element (described below) of the chip assembly 120 and the cap and lead assemblies 122.

The cap and lead assemblies 122 include cylindrical end caps 126 in an exemplary embodiment, and the end caps 126 encircle the ends of the chip assembly 120. Wire leads 112 are coupled to the end caps 126 in a known manner and are mechanically and electrically connected to the chip assembly 120 to define a conductive path through the leads 112 to the fuse element of the chip assembly 120. The end caps 126 are filled with solder 128 to provide secure mechanical and electrical engagement to the chip assembly 120 as further explained below. The leads 112 extend from the end caps 126 and may be shaped or bent after the fuse 106 is assembled to install the leads into through-holes 110 (FIG. 1) of a circuit board 102. The leads 112 may be quickly secured to the board 102 via sockets or clips 114 (FIG. 1) that are configured to receive and engage the leads 112. Alternatively, the leads 112 may, in turn, be soldered to the board 102 as desired to securely connect the fuse 106 to the board 102.

Cylindrical cap and wire lead assemblies 122 are fabricated from, for example, deep drawn or die cast metal according to precision formation techniques, and cap and lead assemblies suitable for purposes of the present invention are commercially available from, for example, Stewart EFI of Thomaston, Conn. It is understood, however, that alternatively shaped end caps 126 (e.g., square or rectangular end caps) could be used in alternative embodiments of the invention. Installation of the cap and lead assemblies 122 to the chip assembly 120 in a manner which may withstand handling of the fuse 106 and bending of the leads 112 for use with the board 102 is described below.

While cap and wire lead assemblies 122 are provided in an illustrative embodiment, it is contemplated that other types of caps and leads could be used in alternative embodiments. For example, stamped and formed contact leads which resiliently engage or clip onto end portions of the chip assembly 120 may be utilized in another embodiment in lieu of wire leads.

Figure 3:
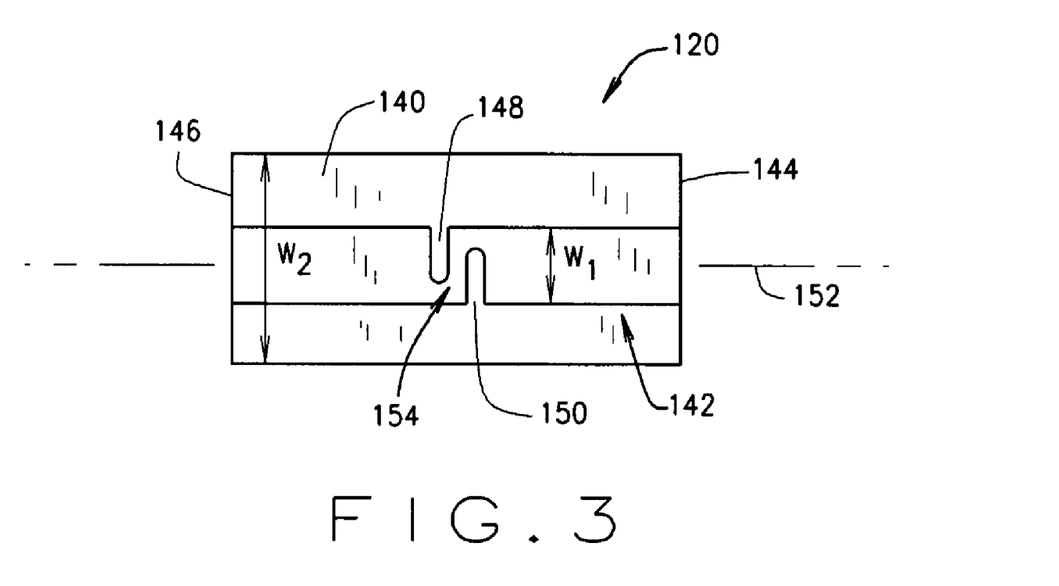
FIG. 3 is a top plan view of the chip fuse shown in FIG. 2 at a first stage of manufacture.

FIG. 3 is a top plan view of the chip assembly 120 at a first stage of manufacture. The chip assembly 120 includes a substrate 140 and a fuse element 142 extending on the substrate 140. In an exemplary embodiment the substrate 140 is a known insulative material having a generally rectangular shape and a low profile in accordance with known chip fuses. The substrate may be fabricated from, for example only, a ceramic material, or a high temperature organic dielectric substrate (e.g. FR-4, phenolic or other polymer-based material a polymer-based material) of selected dimensions to form a substrate structure for the fuse element 142.

The fuse element 142 is fabricated from a conductive material and is extended over the substrate to form a low resistance fuse construction. In different embodiments, the fuse element layer 142 is a metallized layer fabricated to include a thin film or thick film metallization layer, and in one embodiment includes a thin film metallized layer, such as a copper foil layer defining a fuse element, and the metallized fuse layer may be applied to the substrate according to known techniques such as vapor deposition, screen printing, or electroplating processes. The fuse element geometry may be varied by chemically etching or laser trimming the metallized layer forming the fuse element. Alternatively, the fuse element may include a printed thick film conductive material, such as a conductive ink, forming a shaped fuse element and conductive pads for connection to an electrical circuit. In one embodiment, the fuse element 142 is fabricated from gold, although it is appreciated that other conductive metals, alloys, and compositions may be used to fabricate the fuse element 142. More than one fuse element may be provided for higher current applications, and the fuse elements may be provided on the same or different surfaces of the substrate. That, is one or more fuse elements 142 may be provided on each of the outer surfaces of the substrate (e.g., four fuse elements on four different surfaces of the substrate between the end portions thereof).

The chip assembly 120 is of a layered construction including the fuse element 142 electrically extending above the substrate 140 between the ends 144, 146 of the substrate 140. In one embodiment, the fuse element 142 is formed on the substrate 140 as a thin strip or ribbon of conductive material extending from the substrate end 144 to the substrate end 146. The strip or ribbon of conductive material has a substantially constant width $W_1$ that is less than a width $W_2$ of the substrate 140. Offset plunge cuts 148, 150 are made into the fuse element 142 and extend transversely to a longitudinal axis 152 of the fuse element 142 to define a thin fuse link 154 between the plunge cuts 148, 150. By selecting the offset spacing of the plunge cuts 148, 150 along the longitudinal axis 152, the cross sectional area of the fuse link 154 may be determined. The plunge cuts 148, 150 may be made according to known laser machining operations to remove selected portions of the fuse element 142 to define the fuse link 154. The fuse link 154 is sometimes referred to as a weak spot due to its relatively small cross sectional area in relation to the remainder of the fuse element, and the resultant high resistance of the fuse link 154.

When current flowing through fuse element 142 reaches a predetermined limit, the fuse element 142, and more particularly the fuse link 154 melts, vaporizes, or otherwise opens the electrical circuit through the fuse element 142 and prevents costly damage to electrical components in the circuit associated with the chip assembly 120. Overcurrent protection is therefore provided by the fuse element 142.

In a further embodiment, and as those in the art will no doubt appreciate, a Metcalf type alloying technique may be applied to the fuse link 154 to form an M-spot (not shown) in the location of the fuse link 154 for modifying the operating characteristics of the fuse element layer 142.

Figure 4:
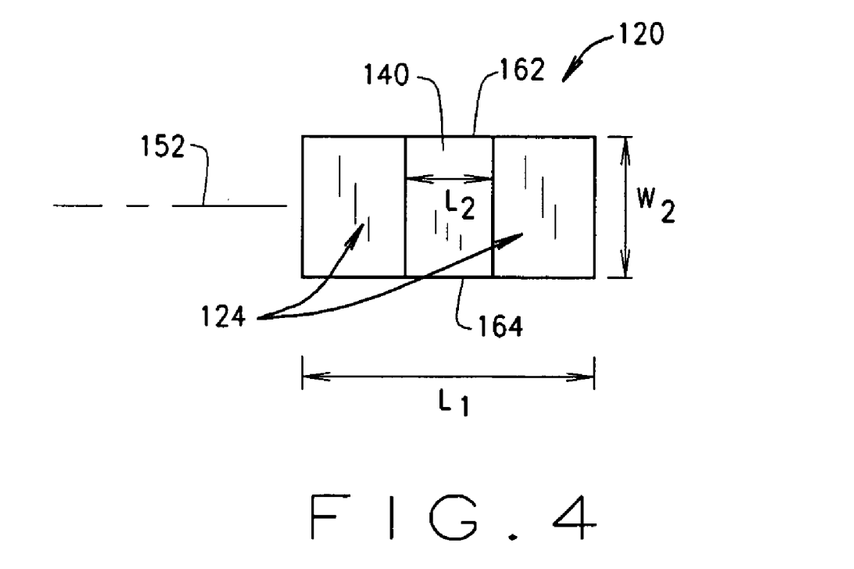
FIG. 4 is a top plan view of the fuse shown in FIG. 3 at a second stage of manufacture.
Figure 5:
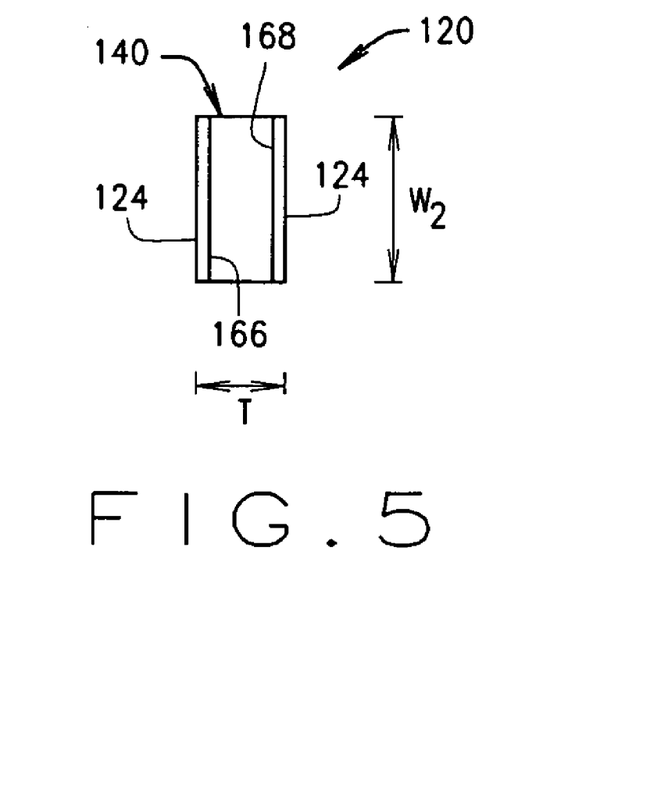
FIG. 5 is an end view of the fuse shown in FIG. 4.

FIGS. 4 and 5 are a top plan view and an end view, respectively, of the chip assembly 120 at a second stage of manufacture wherein conductive pads 124 are applied to the end portions of the substrate 140. In an illustrative embodiment, the conductive pads 124 extend to the respective ends 144, 146 of the substrate 140 and extend the full width $W_2$ between the lateral side edges 162, 164 of the substrate 140. The pads 124 extend longitudinally across the substrate 140 (i.e., in the direction of the axis 152) for a distance less than the length $L_1$ of the substrate 140 which results in an open area or space having a length $L_2$ between the contact pads 164. The fusible link 154 (FIG. 3) is located in the open area or space between the contact pads 124 on one face of the substrate 140.

As shown in FIG. 5, the conductive pads 124 extend on each of the opposed surfaces or faces 166, 168 of the substrate 140. One of the surfaces 166 and 168 includes the fuse element 142 (FIG. 3) thereon, and the contact pads 124 are formed over the ends of the fuse element 142 on one of the surfaces 166, 168, and the contact pads 124 are formed directly on the substrate 140 on the other of the surfaces 166 and 168. As such, the contact pads 124 extend in pairs on each of the surfaces 166, 168 of the substrate 140, and one of the pairs 124 defines terminations for the fuse element 142. In other words, the pairs of conductive pads 124 on opposing surfaces 166, 168 of the substrates provides electrical connection to the fuse element 142 on the one surface, and the other provides mechanical strength and stability to the other surface of the substrate 142 when the cap and lead assembly 122 is attached to the chip assembly 120 as explained below. While four pads 124 are provided on the chip fuse assembly 120 in the illustrated embodiment, it is contemplated that greater or fewer numbers of pads 124 may be utilized in alternative embodiments of the invention.

In an exemplary embodiment, the pads 124 are fabricated from a solderable material, such as silver in one embodiment, that facilitates a secure mechanical bond and reliable electrical connection to the cap and lead assembly 122 as described below. The pads 124 may be fabricated from a different material than the fuse element 142, which is one embodiment is fabricated from gold, although the pads 124 and fuse element 142 may be fabricated from the same material and be integrally formed with one another in alternative embodiments. A variety of conductive and solderable materials are known in the art and can be used in different combinations to form the fuse element 142 and the pads 124. The pads may be applied to the surfaces 166, 168 of the substrate in a known manner, such as using any of the aforementioned thick film and thin film materials and techniques.

While the pads 124 are illustrated in the Figures as extending from one lateral edge to the other lateral edge 164 (FIG. 4) of the substrate 140, and also to both ends 144, 146 (FIG. 3) of the substrate 140, it is recognized that the pads 124 need not extend to the lateral edges 162, 164 and/or the ends 144, 146 in order to achieve the benefits of the invention. While extending the pads to the lateral edges 162, 164 and the ends 144, 146 is believed to be beneficial to increase the surface area of the solderable contact pads 124 on each surface 166, 168 of the substrate, it is contemplated that smaller contact pads 124 may be utilized, which do not extend to the edges 162, 164 and/or the substrate ends 144, 146 in alternative embodiments.

The assembly 120 has a thickness T which is measured perpendicularly to the substrate dimensions $L_1$ and $W_2$ (FIG. 4) and providing a generally rectangular profile of the chip assembly 120. The dimensions $L_1$, $W_2$ and T may vary in different embodiments of the invention.

Figure 6:
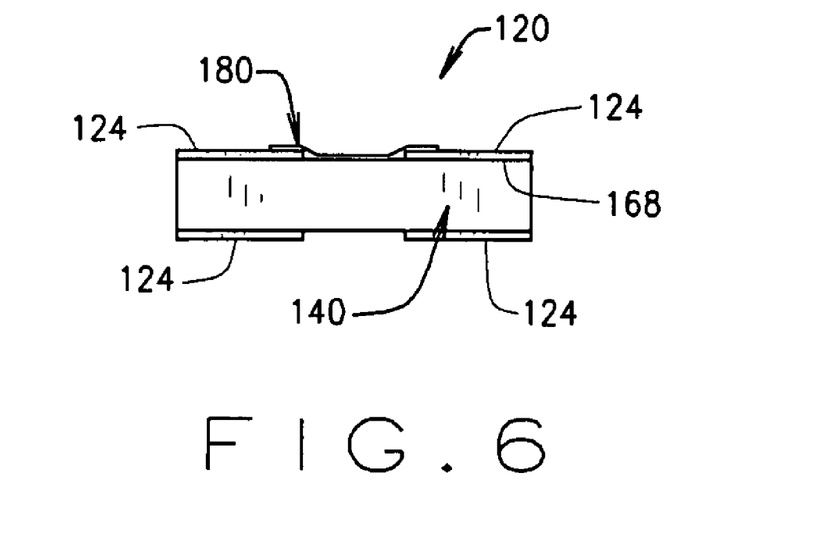
FIG. 6 is a side elvational view of the fuse shown in FIGS. 3 and 4 at a third stage of manufacture.

FIG. 6 is a side elevational view of the chip assembly 120 at a third stage of manufacture including a protective cover 180 extending between the contact pads 124 on one surface 166 of the substrate 140. The protective cover 180 in one embodiment is a nonconductive member fabricated from, for example, an insulating glass material, although other insulating materials could be used in alternative embodiments. The protective cover 180 overlies the fuse element 142 (FIG. 3) and the fuse link 154 (also shown in FIG. 3) extending on the substrate surface 166. The protective cover 180 extends across the entire width $W_2$ (FIG. 4) of the chip assembly 120 in one embodiment, and extends at least the length $L_2$ (FIG. 4) between the contact pads 124. In other embodiments, the cover 180 extends for less than the distance $W_2$. The protective cover 180 may be applied over the fuse element 142 according to known techniques.

Figure 7:
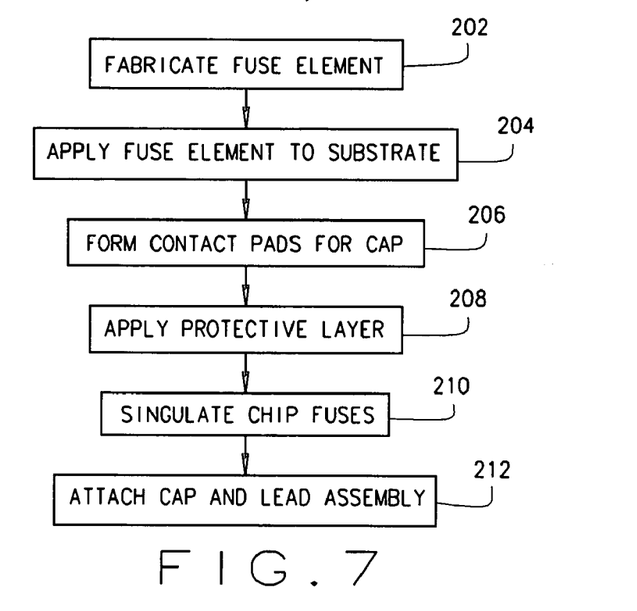
FIG. 7 is a method flowchart of a method to fabricate the leaded chip fuse shown in FIGS. 1 and 2.

FIG. 7 is a method flowchart 200 of a fabrication method to manufacture the chip assembly 120 (shown in FIGS. 2-6). The method 200 includes fabricating 202 the fuse element, applying 204 the fuse element to the substrate, forming 206 the contact pads, and applying 208 the protective cover over the fuse element.

In embodiments wherein the fuse element is deposited or metallized on the substrate, fabricating 202 the fuse element and applying 204 the fuse element to the substrate may occur more or less simultaneously. In alternative embodiments, the fuse element may be formed and fabricated into a freestanding structure and subsequently coupled to the substrate via, for example, a known adhesive or adhesiveless lamination process. Fabrication 202 of the fuse element also includes shaping the fuse element to include a fusible link 154 (FIG. 3) via the aforementioned plunge cuts 148, 150 (FIG. 3), although it is recognized that fuse links of reduced cross sectional area may be alternatively formed into other shapes and configurations accordingly to known techniques. As mentioned previously, more than one fuse element may be fabricated and/or formed on the subtstrate.

With respect to forming 206 the contact pads, the contact pads extending on the substrate opposite to the fuse element are formed prior to the contact pads overlying the fuse element in one embodiment. The contact pads overlying the fuse element layer are formed subsequent to the contact pads directly contacting the substrate opposite the fuse element so as to avoid damage to the fuse element during formation of the pads extending opposite the fuse element.

In an exemplary embodiment, chip assemblies 120 are formed in a batch process in which a multitude of fuse elements, contact pads, and protective layers are formed and arranged on a larger piece of substrate material that is diced, cut or otherwise singulated 210 into discrete chip assemblies 120. After singulation, the cap and lead assemblies 122 are attached to the chip assembly 120 in the manner described below.

Figure 8:
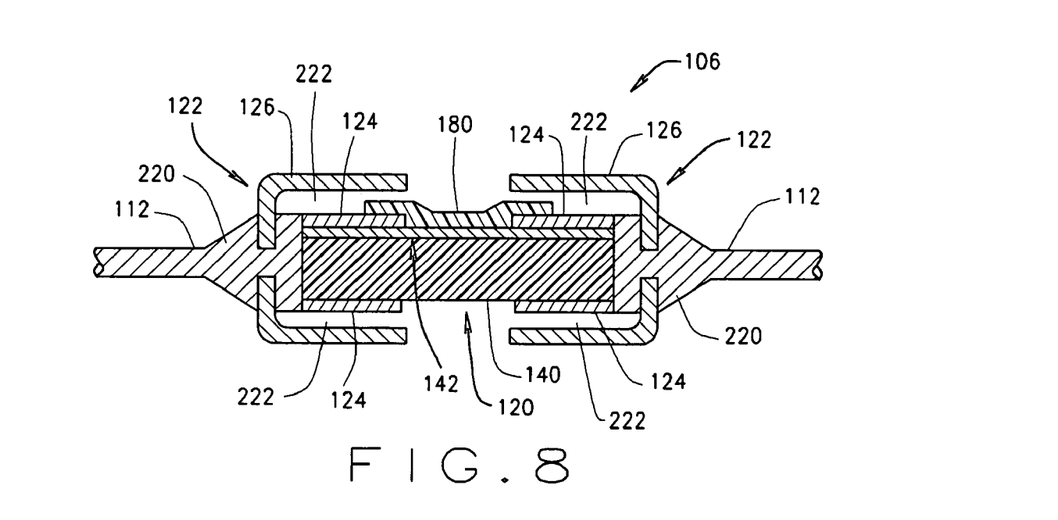
FIG. 8 is a cross sectional view of the fuse shown in FIG. 2 along line 8-8.

FIG. 8 is a cross sectional view of the leaded chip fuse 106 at a final stage of manufacture wherein the chip assembly 120 is fitted within the cap and lead assemblies 122 on either end thereof. The fuse element 142 is extended on the substrate 140, and the contact pads 124 overlie portions of the fuse element 142 on one side of the substrate 140, and are applied directly to the other side of the substrate 140. The protective cover 180 overlies the fuse element 142 between the contact pads 124 on one side of the substrate 140.

The cap and lead assemblies 122 are fitted over the ends 144, 146 (FIG. 3) of the substrate 140 so that the leads 112 are in electrical contact with the fuse element 142 on the ends 144, 146 of the substrate 140. Optionally, the end caps 126 are coupled to conical shaped portions 220 of the leads, and the end caps 126 extend cylindrically over and spaced from the contact pads 124 on each side of the chip assembly 120. A diameter of the end caps is larger than a diagonal dimension of the chip assembly 120 (i.e., a line connection the dimensions T and $W_2$ across opposite corners of the chip assembly 120 shown in FIG. 5) so that spaces or voids 222 are created between inner surfaces of the end caps and outer surfaces of the contact pads 124. The voids 124 are filled with solder 128 (FIG. 2) to surround the chip assembly 120 and mechanically and electrically connect the wire and lead assemblies 122 to the ends of the chip assembly 120. It is understood that the voids 124 can be very small in certain embodiments, and the diameter of the end caps may be nearly equal to the diagonal dimension of the chip assembly 120 while still achieving the benefits of the invention. For example, the ends of the chip assembly 120 may be dipped in a solder paste and received in closely fitting end caps with little clearance between inner surfaces of the end caps and the outer surfaces of the substrate, while the solder still encircles and surrounds the outer surfaces of the chip assembly.

Figure 9:
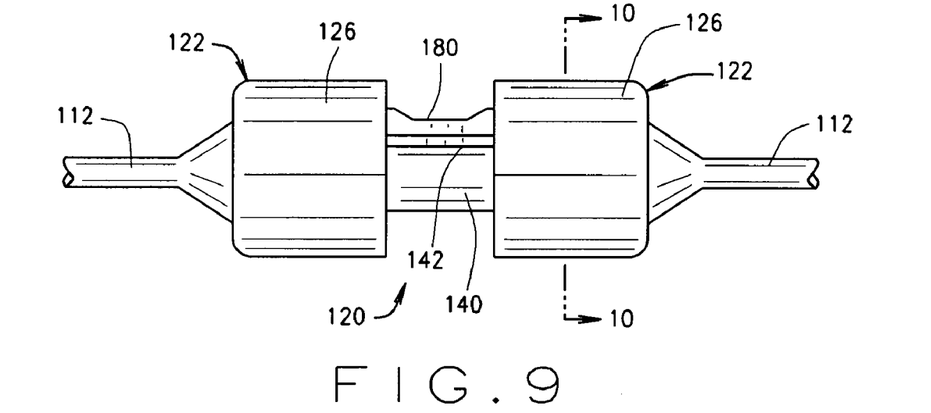
FIG. 9 is a side elavational view of the fuse shown in FIG. 8 at a final stage of manufacture.

FIG. 9 is a side elevational view of the chip fuse 106 at a final stage of manufacture wherein the chip assembly 120 is fitted within the cap and lead assemblies 122 on either end thereof are soldered to the ends of the chip fuse with the contact pads 124 (FIG. 8) overlying the fuse element 142 and establishing electrical connection from the cap and lead assemblies 122 to and through the fuse element 142. The protective cover 180 overlies and protects the fuse element 142 between the end caps 126, and the leads 112 are securely attached to the end of the chip assembly 120.

Figure 10:
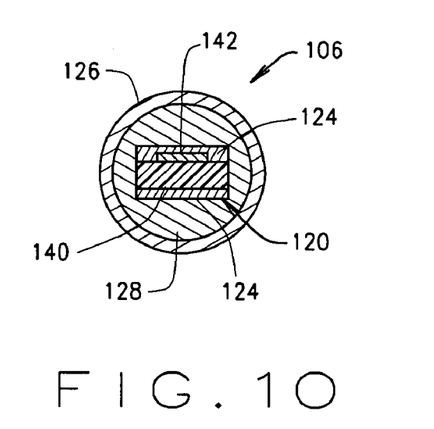
FIG. 10 is a cross sectional view of the fuse shown in FIG. 9 taken along line 10-10.

FIG. 10 is a cross sectional view of the fuse 106 illustrating an end of the chip assembly 120 surrounded and encircled by solder 128 within the cylindrical end cap 126. The solder 128 contacts the entire outer surface 124 of contact pads on both sides of the chip assembly 120, and because of the solderability of the contact pads 124, the solder 128 adheres to the contact pads 128 and creates a good electrical connection to the end caps 126, as well as a strong structural connection to mechanically engage and maintain the leads 112 (FIG. 9) to the chip assembly 120. In particular, and because of the solder 128 encircling and surrounding the chip assembly 120, the cap and lead assemblies may withstand applied mechanical stress and strain as the leads 112 (FIGS. 1 and 2) are formed, bent or otherwise shaped into a right angle configuration for installation to the circuit board 102 (FIG. 1) and/or fuse sockets or clips 114 (FIG. 1). The considerable overhang of the end caps 126 on the ends of the chip assembly 120 (FIG. 8), and the solder 128 surrounding the chip assembly 120 on all four sides thereof (FIG. 10) within the end cap 126 capably resists any tendency of the end caps 126 to shear or break away from the chip assembly 120 as the chip fuse 106 is handled for installation to the circuit board 102.

It is recognized that other mediums could be used in lieu of solder in alternative embodiments to form secure electrical and mechanical bonds to and between the leads 112, the fuse element 142, and the contact pads 124. For example, conductive adhesive materials, brazing alloys, and the like may be used in alternative embodiments in lieu of solder.

A leaded chip fuse 106 is therefore provided which offers matching performance of conventional chip fuses with installation features of conventional miniature electronic fuses, namely the axial leads 112. The leaded chip fuse 106 may therefore be quickly installed to a circuit board as a replacement for a surface mount fuse 104 (FIG. 1) without requiring replacement of the board or time consuming and relative expensive removal of the surface mount fuse 104 from the board and surface mounting another fuse or fuses 104 to the board 102. The fuse 106 may be manufactured at relatively low cost in a highly reliable form using the methodologies described herein.

While the invention has been described in terms of various specific embodiments, those skilled in the art will recognize that the invention can be practiced with modification within the spirit and scope of the claims.

What is claimed is:

1. A chip fuse comprising:
    a substrate;
    at least one fuse element extending on said substrate;
    first and second leads coupled to said fuse element; and
    first and second conductive end caps, each of said conductive end caps encircling a first end and a second end of said substrate.

2. A chip time in accordance with claim 1 further comprising a protective cover overlying a portion of said fuse element.

3. A chip fuse in accordance with claim 1 wherein said substrate comprises opposing surfaces, said fuse element extending on at least one of said opposing surfaces, and contact pads extending over portions of said fuse element and establishing electrical connection to said first and second leads.

4. A chip fuse in accordance with claim 1 wherein said substrate comprises opposing surfaces, and contact pads extending on each of said opposing surfaces and establishing electrical connection to said first and second leads.

5. A chip fuse in accordance with claim 1 wherein said substrate is substantially rectangular, and each of said first and second leads comprises a wire lead.

6. A chip fuse in accordance with claim 1 wherein said substrate is fabricated from at least one of a ceramic material or a polymer-based material.

7. A chip fuse in accordance with claim 1 wherein at least one of said first and second leads comprises a wire lead, at least one of said first and second end caps spaced from outer surfaces of the substrate, thereby forming a void between said at least one end cap and said substrate, said void filled by a conductive medium to surround said substrate within said at least one end cap and mechanically and electrically engage said wire lead to said substrate.

8. A chip fuse comprising:
    a substrate layer having a first end, a second end, and opposing surfaces extending between said first end and said second end;
    first and second wire lead assemblies, wherein each of said first and second wire lead assemblies comprises a conductive end cap and a wire lead; and
    at least one fuse element extending over said substrate layer and mechanically and electrically connected to said first and second wire lead assemblies;
    wherein each of said conductive end caps encircle said first and said second ends of said substrate.

9. A chip fuse in accordance with claim 8 further comprising a protective cover overlying a portion of said fuse element between said first and second wire lead assemblies.

10. A chip fuse in accordance with claim 8 wherein said fuse element extends on one of said opposing surfaces, said fuse further comprising contact pads extending over end portions of said fuse element, said contact pads establishing electrical connection to said first and second wire lead assemblies.

11. A chip fuse in accordance with claim 8 further comprising contact pads extending on each of said opposing surfaces and establishing electrical connection to said first and second wire lead assemblies.

12. A chip fuse in accordance with claim 8 wherein said conductive end caps are spaced from a respective pair of contact pads on opposing surfaces of said substrate, and wherein at least one of a conductive adhesive, brazing alloy, and solder electrically and mechanically connects said contact pads to said wire leads.

13. A chip fuse in accordance with claim 8 wherein said substrate is fabricated from at least one of a ceramic material or a polymer based material.

14. A chip fuse in accordance with claim 8 wherein said conductive end caps are soldered to opposing ends of said fuse element.

15. A chip fuse in accordance with claim 8 further comprising solderable contact pads on each of said opposing surfaces of said substrate for connecting said respective end caps of said first and second lead assemblies, respectively.

16. A chip fuse in accordance with claim 8 further comprising solderable contact pads on each of said opposing surfaces of said substrate, wherein when said conductive end caps are soldered to said first and second end, said first and second end portions are encircled by solder to form a secure mechanical and electrical connection.

17. A chip fuse comprising:
    a substrate comprising a first end, a second end and opposing surfaces extending between said first end and said second end;
    at least one fuse element extending on said substrate;
    first and second leads coupled to said fuse element; and
    contact pads extending on each of said opposing surfaces and establishing electrical connection to said first and second leads.

18. A chip fuse in accordance with claim 17 further comprising a protective cover overlying a portion of said fuse element.

19. A chip fuse in accordance with claim 17 wherein said fuse element extending on at least one of said opposed surfaces, and said contact pads extending over portions of said fuse element.

20. A chip fuse in accordance with claim 17 wherein said substrate is substantially rectangular, and each of said first and second leads comprises a wire lead, said chip fuse further comprising first and second end caps, each of said end caps encircling said first and second ends of said substrate.

21. A chip fuse in accordance with claim 17 wherein said substrate is fabricated from at least one of a ceramic material or a polymer-based material.

22. A chip fuse in accordance with claim 17 wherein at least one of said first and second leads comprises a wire lead, said chip fuse further comprising at least one end cap, said end cap spaced from outer surfaces of the substrate, thereby forming a void between said end cap and said substrate, said void filled by a conductive medium to surround said substrate within said end cap and mechanically and electrically engage said wire lead to said substrate.

23. A chip fuse comprising:
   a chip assembly comprising:
      a substrate; and
      at least one fuse element extending on said substrate;
   first and second leads coupled to said fuse element; and
   first and second conductive end caps, each of said end caps encircling a first end and a second end of said chip assembly, wherein at least a portion of said chip assembly is exposed to the atmosphere.

24. A chip fuse in accordance with claim 23 wherein said chip assembly further comprises a protective cover overlying a portion of said fuse element.

25. A chip fuse in accordance with claim 23 wherein said substrate comprises opposing surfaces, said fuse element extending on at least one of said opposing surfaces, and wherein said chip assembly further comprises contact pads extending over portions of said fuse element and establishing electrical connection to said first and second leads.

26. A chip fuse in accordance with claim 23 wherein said substrate comprises opposing surfaces and wherein said chip assembly further comprises contact pads extending on each of said opposing surfaces and establishing electrical connection to said first and second leads.

27. A chip fuse in accordance with claim 23 wherein said substrate is substantially rectangular, and each of said first and second leads comprises a wire lead.

28. A chip fuse in accordance with claim 23 wherein said substrate is fabricated from at least one of a ceramic material or a polymer-based material.

29. A chip fuse in accordance with claim 23 wherein at least one of said first and second leads comprises a wire lead, at least one of said first and second end caps spaced from outer surfaces of the substrate, thereby forming a void between said at least one end cap and said substrate, said void filled by a conductive medium to surround said substrate within said at least one end cap and mechanically and electrically engage said wire lead to said substrate.

* * * * *

UNITED STATES PATENT AND TRADEMARK OFFICE
CERTIFICATE OF CORRECTION

PATENT NO.       : 7,569,907 B2                                  Page 1 of 1
APPLICATION NO.  : 11/091665
DATED            : August 4, 2009
INVENTOR(S)      : Vernon Raymond Spaunhorst It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 591 days.

Signed and Sealed this

Seventh Day of September, 2010

David J. Kappos
*Director of the United States Patent and Trademark Office*